United States Patent

Nakanishi

[11] Patent Number: 5,949,830
[45] Date of Patent: Sep. 7, 1999

[54] SMALL WIRELESS RADIO

[75] Inventor: Hideo Nakanishi, Kanagawa, Japan

[73] Assignee: Matsushita Electric Industrial Co., Ltd., Osaka, Japan

[21] Appl. No.: 08/879,439

[22] Filed: Jun. 20, 1997

[30] Foreign Application Priority Data

Aug. 23, 1996 [JP] Japan .................................. 8-222332

[51] Int. Cl.$^6$ ........................... H04L 27/14; H04L 27/06; H03D 3/00; H04B 1/26
[52] U.S. Cl. ........................ 375/334; 375/344; 329/302; 455/209; 455/257; 455/260; 455/314
[58] Field of Search ................................... 375/334, 335, 375/272, 275, 327, 344; 329/302, 300, 319, 323, 315; 455/205, 208, 209, 255, 256, 257, 258, 259, 260, 264, 323, 313, 314, 316, 317, 182.1, 182.2, 164.1, 164.2, 192.1, 192.2

[56] References Cited

U.S. PATENT DOCUMENTS

| | | | |
|---|---|---|---|
| 4,817,197 | 3/1989 | Shimizu et al. | 455/208 |
| 5,115,515 | 5/1992 | Yamamoto et al. | 455/260 |
| 5,361,407 | 11/1994 | Sawada et al. | 455/309 |
| 5,402,446 | 3/1995 | Minami | 375/344 |
| 5,857,004 | 1/1999 | Abe | 375/344 |

*Primary Examiner*—Stephen Chin
*Assistant Examiner*—Betsy L. Deppe
*Attorney, Agent, or Firm*—Pearne, Gordon, McCoy & Granger LLP

[57] ABSTRACT

In a direct conversion receiver with an AFC function comprising a local oscillation circuit constituted by a synthesizer, the local oscillation frequency is prevented from radiating as an interfere wave against the receiver per se so as not to reduce the reception characteristic, and it is made possible to reduce the value of the multiplication factor N of a multiplier in the synthesizer without making the frequency of a VCO per se high. Specifically, a first local oscillation signal 12 obtained by multiplying an output frequency $F_X$ of a reference crystal oscillation circuit portion 8 of a synthesizer circuit section 7 by M by a multiplier 11 is mixed with an FSK modulation signal 1 in a first mixer 4. In a second mixer 5, the thus mixed signal is further mixed with a second local oscillation signal 13 obtained by multiplying an output frequency $F_V$ of a synthesizer 9 by N by a multiplier 10. The frequencies of the first and second local oscillation signals are selected so as to establish the condition $M \cdot F_X > N \cdot F_V$ so that the multiplication factor N of the multiplier 10 can be made small.

6 Claims, 5 Drawing Sheets

SMALL WIRELESS RADIO

BACKGROUND OF THE INVENTION

The present invention relates to a direct conversion type of a small wireless radio which does not use any SAW (surface acoustic wave) filter having a steep cut-off frequency characteristic.

Conventionally, in a direct conversion type of a reception circuit of a small wireless radio, as shown in FIG. 5, an FSK (frequency shift keying) modulation signal 1 received through an antenna 2 is subjected to orthogonal conversion by means of mixers 5a and 5b with second local oscillation signals which are obtained directly and through a phase shifter 16A from the frequency F1 of the local oscillation signal generated by a multiplier 10. A synthesizer circuit 9 constituted by a VCO 28, a PLLIC 26 and an LPF 27 produces an output of a frequency $F_V$, and this output frequency $F_V$ is then multiplied by N by the multiplier 10. The multiplier outputs the signal of the frequency $N \cdot F_V$ which is the above-mentioned second oscillation signal of the frequency F1. The frequency bands of the thus obtained base band signals are limited through channel filters 14a and 14b and limiter amplifiers 15a and 15b respectively. The frequency of an FSK wave obtained by an orthogonal modulator 18 is detected by a detector 21. The reference numeral 16B designates a phase shifter. In the drawing, reference numerals 16A and 16b denote phase shifters, and numeral 17 denotes an oscillator which generates a rectangular oscillation signal.

The average voltage of the frequency-to-voltage relational characteristic (hereinafter referred to as an F/V curve) obtained on the basis of the detection output is compared with a reference voltage by a frequency drift detector 22. An AFC control signal 23 corresponding to the quantity of the frequency deviation is sent to a reference crystal oscillation circuit portion 8 so that the oscillation frequency of a crystal oscillation circuit 25 is controlled through a frequency control portion 24.

Here, the reception frequency of the FSK modulation signal 1 is presented by $f_0$, the oscillation frequency of the VCO 28 is presented $F_V$, the value of multiplication factor of the multiplier is presented by N, and the frequency of the local oscillation signal is presented by F1. Then, the following expression (equation 1) is established because of the direct conversion.

$f_0 = F1 = N \cdot F_V$ $N = f_0/F_V$

It is found that the reception frequency $f_0$ is equal to the local oscillation frequency F1, and the value of N cannot be reduced unless $F_V$ is increased.

In the foregoing conventional receiver of the direct conversion type, since the reception frequency $f_0$ is equal to the local oscillation frequency F1, it is necessary to strictly shield the local oscillation circuit with a shielding plate to prevent the local oscillation frequency from radiating as an interfere wave against the receiver per se so as not to lower the reception characteristic.

Further, in order to reduce the value of the multiplication factor N of the multiplier, it was necessary to change the design so as to increase the frequency of the VCO per se.

Thus, there has been such a problem that the design of the local oscillation circuit is difficult.

SUMMARY OF THE INVENTION

The present invention is intended to solve the foregoing conventional problem, and an object of the present invention is to provide a small wireless radio in which a local oscillation frequency is never radiated as an interfere wave against the receiver per se to make the reception characteristic deteriorate, and in which the value of the multiplication factor N of a multiplier in a synthesizer can be reduced without making the frequency of the VCO per se high.

In order to achieve the above object, according to an aspect of the present invention, a small wireless radio for receiving an FSK modulation signal comprises: a reference crystal oscillation circuit portion constituted by a crystal oscillation circuit and a frequency control portion for controlling a frequency of the crystal oscillation circuit; a first multiplier for multiplying by M a frequency of a signal outputted from the reference crystal oscillation circuit portion; a first mixer for mixing the FSK modulation signal received through an antenna with a first local oscillation signal which is an output of the first multiplier; a synthesizer circuit for varying a channel frequency on the basis of a signal supplied from a CPU by using, as a reference frequency, the frequency of the signal outputted from the reference crystal oscillation circuit portion; a second multiplier for multiplying by N a frequency of a signal outputted from the synthesizer circuit; a second mixer for mixing the mixed signal outputted from the first mixer with a second local oscillation signal which is an output of the second multiplier; a demodulation circuit for demodulating the mixed signal outputted from the second mixer; and a frequency drift detector for detecting frequency drift of a demodulated signal and for outputting an AFC control signal corresponding to a quantity of the detected frequency drift, whereby an oscillation frequency of the crystal oscillation circuit is controlled by means of the frequency control portion on the basis of the AFC control signal.

According to another aspect of the present invention, in the above configuration, the signal obtained by multiplying by N the output of the synthesizer circuit using the output of the reference crystal oscillation circuit portion as a reference frequency is used as the first local oscillation signal to be supplied to the first mixer, and the signal obtained by multiplying by M the output of the reference crystal oscillation circuit portion is used as the second local oscillation signal to be supplied to the second mixer.

In the foregoing configuration, since the local oscillation frequency through the synthesizer circuit can be reduced, the value of the multiplication factor N of the multiplier can be reduced without making the oscillation frequency of the VCO per se high. Therefore, the comparison frequency of the synthesizer can be set a large value so as to shorten the frequency convergence time. Further, since the C/N (carrier/ noise) characteristic of the synthesizer local oscillation circuit can be improved so that the frequency selection can be performed in a lower frequency range where the multiplication factor is small, the spurious characteristic can be improved. Furthermore, since the local oscillation frequency is made to be different from the reception frequency, it is possible to omit a shielding plate of the local oscillation circuit for eliminating the deterioration of the reception characteristic due to radiation of the local oscillation frequency.

DETAILED DESCRIPTION OF PREFERRED EMBODIMENTS

Embodiments of the present invention will be described below in detail with reference to accompanying drawings.

Embodiment 1

Figure 1:
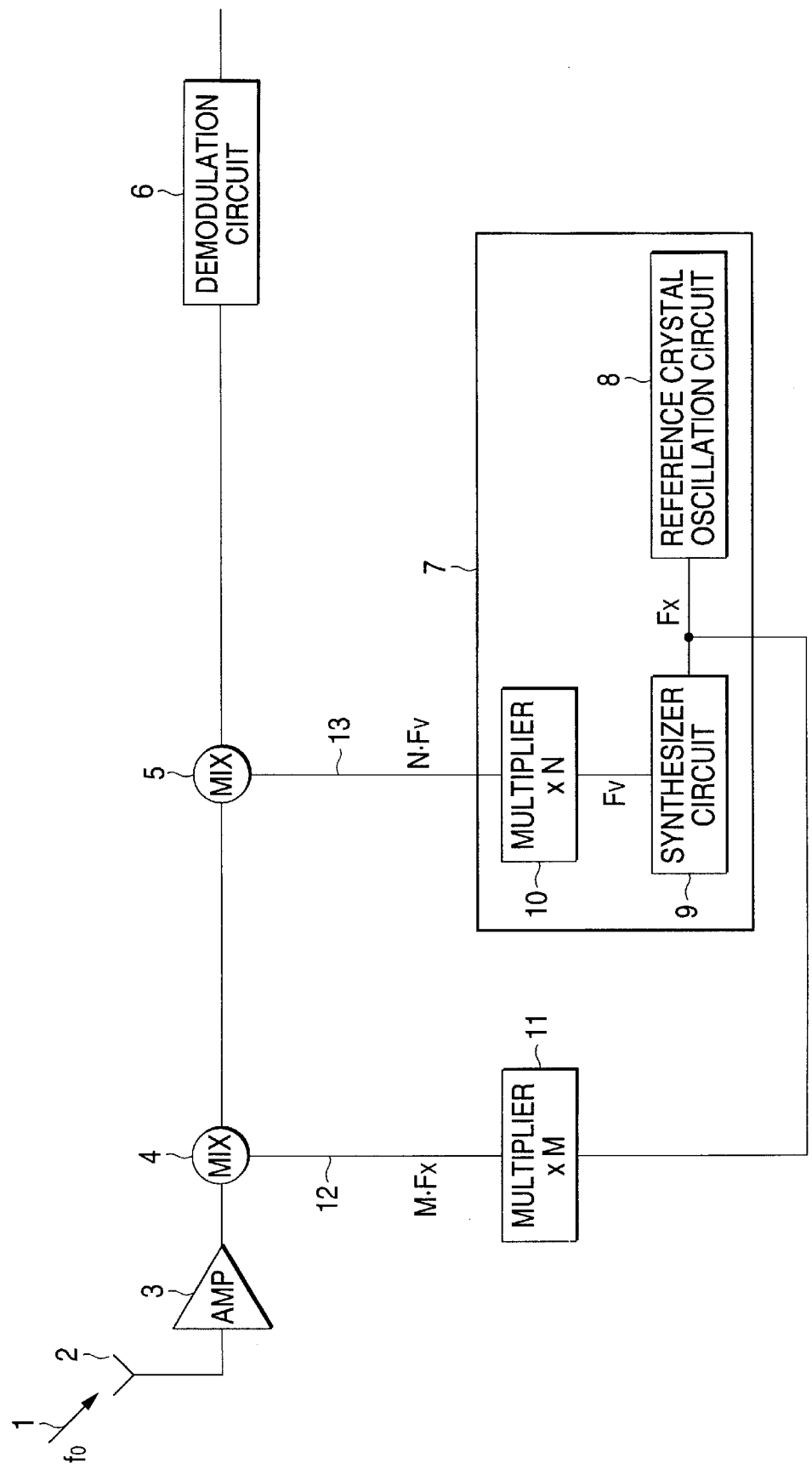
FIG. 1 is a block diagram showing a configuration of a small wireless radio according to a first embodiment of the present invention.

FIG. 1 shows the configuration of a small wireless radio according to first embodiment of the present invention, which is a direct conversion receiver in which a second local oscillation circuit is constituted by a synthesizer circuit section. The reference numeral 1 designates an FSK (frequency shift keying) modulation signal having a reception frequency $f_0$; 2, an antenna; 3, an amplifier; 4, a first mixer; 5, a second mixer; and 6, a demodulation circuit. The reference numeral 7 designates a synthesizer circuit section which is constituted by a reference crystal oscillation circuit portion 8, a synthesizer circuit 9, and an N-multiplying multiplier 10. The reference numeral 11 designates an M-multiplying multiplier which is configured so as to multiply by M an oscillation frequency $F_X$ of the reference crystal oscillation circuit portion 8 to thereby obtain a first local oscillation signal 12 having a frequency $M \cdot F_X$ to be supplied to the first mixer 4. The synthesizer circuit 9 supplied with the output signal of the reference crystal oscillation circuit portion 8 having the oscillation frequency $F_X$ outputs a signal having a frequency $F_V$. The multiplier 10 multiplies by N the signal having the frequency $F_V$ and supplies the thus N-multiplied signal to the second mixer 5 as a second local oscillation signal 13 having a frequency $N \cdot F_V$.

Figure 2:
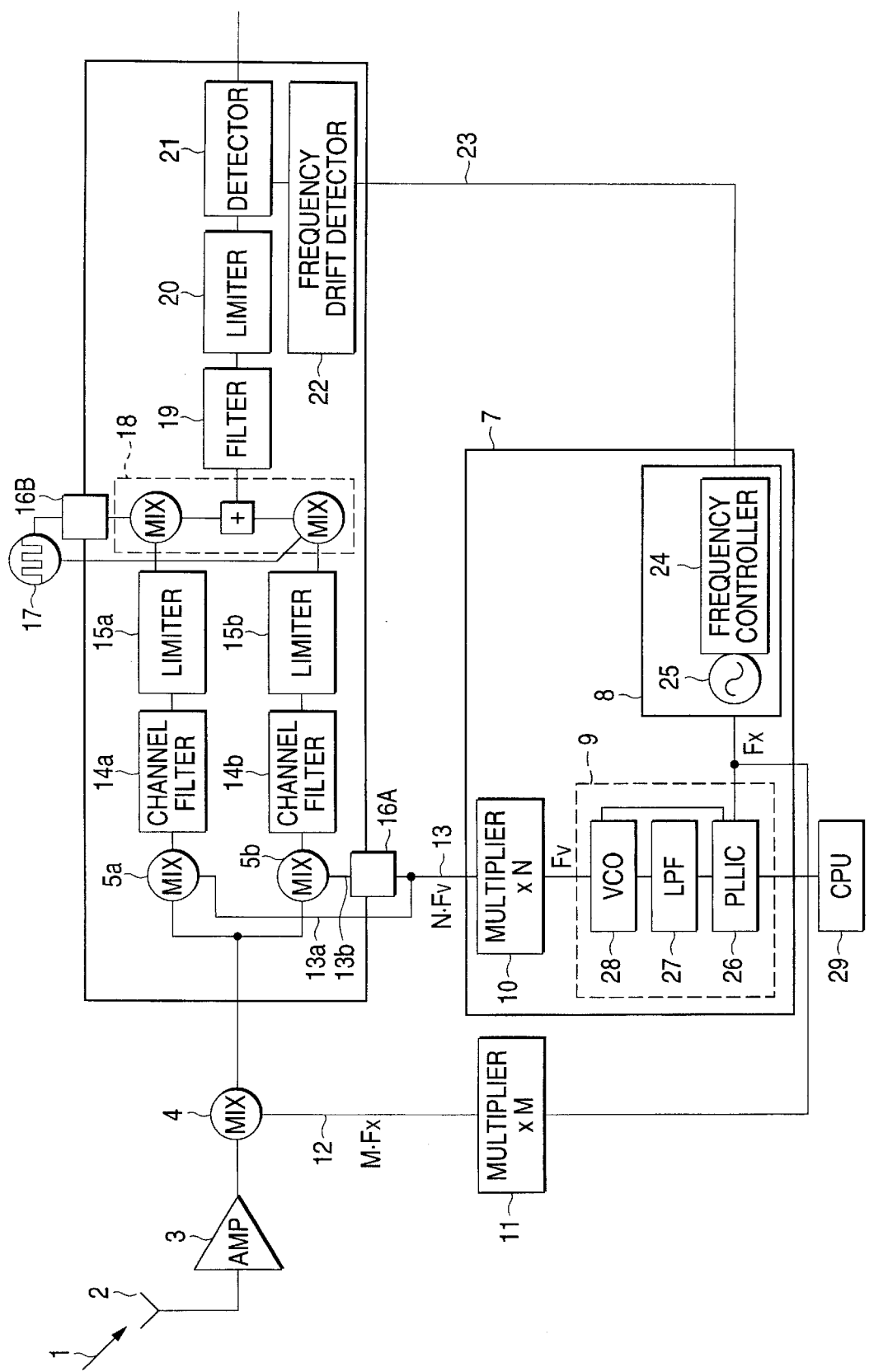
FIG. 2 is a block diagram showing a specific configuration of the small wireless radio according to the first embodiment.

Next, the operation of the first Embodiment according to the present invention will be described with reference to FIG. 2 which shows a further specific configuration. First, in the first mixer 4, the FSK modulation signal of the reception frequency $f_0$ which is received through the antenna 2 is mixed with the first local oscillation signal 12 of the frequency $M \cdot F_X$ formed by multiplying the frequency $F_X$ produced from the reference crystal oscillation circuit portion 8 by M by means of the multiplier 11. On the other hand, the frequency $F_V$ produced from the synthesizer circuit 9 for varying the channel frequency on the basis of a signal produced from a CPU 29 by using the frequency $F_x$ of the signal produced from the reference crystal oscillation circuit portion 8 as the reference signal is multiplied by N by the multiplier 10. The mixed signal having a frequency $f_0 - M \cdot F_X$ is supplied from the first mixer 4 to each of the second mixers 5a and 5b. On the other hand, the second local oscillation signal 13 having a frequency of $N \cdot F_V$ produced from the multiplier 10 is supplied to the second mixers 5a and 5b directly and through an phase shifter 16A as the second local oscillation signals 13a and 13b respectively, so that the frequency $f_0 - M \cdot F_X$ is orthogonally converted through the second mixers 5a and 5b. In FIG. 2, reference numerals 16A and 16B denote phase shifters and 17 denotes an oscillator which generates a rectangular oscillating signal.

The I and Q base band signals obtained through the orthogonal conversion are band-limited in channel filters 14a and 14b and limiter amplifiers 15a and 15b respectively and then subjected to orthogonal modulation in an orthogonal modulator 18. The thus orthogonally modulated signal is converted into an FSK wave through a filter 19 and a limiter amplifier 20, and the frequency of the FSK wave is detected by a detector 21. The mean voltage of the frequency-to-voltage relational characteristic (an F/V curve) obtained through the frequency detection by means of the detector 21 is compared with a reference voltage in a frequency drift detector 22.

An AFC control signal 23 outputted from the frequency drift detector 22 correspondingly to the quantity of frequency deviation of the average voltage of the F/V curve is supplied to a frequency control portion 24 of the reference crystal oscillation circuit portion 8. The frequency control portion 24 controls the frequency of a crystal oscillation circuit 25 so that the first local oscillation signal 12 corrects the frequency drift between the mean voltage of the F/V curve and the reference voltage. Similarly to the first local oscillation signal 12, the second local oscillation signal 13 acts so as to correct the frequency drift because, in the synthesizer circuit section 7, the output of the reference crystal oscillation circuit portion 8 is supplied, as a reference frequency, to a PLLIC 26 of the synthesizer circuit 9. Moreover, because the crystal oscillation circuit 25 outputs an oscillation signal which is high in C/N ratio, the multiplication number M of the multiplier 11 is preferably to set larger than the multiplication number N of the multiplier 10. Consequently, in the foregoing configuration, the following equation is established.

$$f_0 = M \cdot F_X + N \cdot F_V$$
$$M \cdot F_X > N \cdot F_V$$

In the thus configured first embodiment according to the present invention, the oscillation frequency $F_X$ outputted from the reference crystal oscillation circuit portion 8 is multiplied by M to thereby obtain the frequency $M \cdot F_X$ of the first local oscillation signal 12 and the reception frequency $f_0$ is mixed with the frequency $M \cdot F_X$ to thereby make it possible to reduce the frequency $N \cdot F_V$ of the second local oscillation signal 13. That is, even when the frequency $F_V$ is fixed, the multiplication factor N of the second local oscillation circuit can be reduced. Further, since the local oscillation frequencies are selected so as to establish the condition $M \cdot F_X > N \cdot F_V$, the local oscillation frequency $N \cdot F_V$ outputted from the synthesizer circuit portion can be reduced, and the value of the multiplication factor N of the multiplier can be reduced without making the oscillation frequency of the VCO per se high. Since the multiplication factor N of the multiplier can be reduced, the comparison frequency of the synthesizer can be set to a value larger than that of the conventional one to make it possible to shorten the frequency convergence time.

Moreover, the C/N characteristic of the local oscillation circuit constituted by the synthesizer can be improved. Further, since the frequency selection can be performed in a lower frequency range where the multiplication factor is small, the spurious characteristic is improved. Furthermore, since the local oscillation frequency is different from the reception frequency, it is possible to omit a shielding plate of the local oscillation circuit for preventing deterioration of the reception characteristic of receiver due to radiation of the local oscillation frequency. Consequently, excellent mount efficiency can be obtained so that the material cost can be reduced.

Embodiment 2

Figure 3:
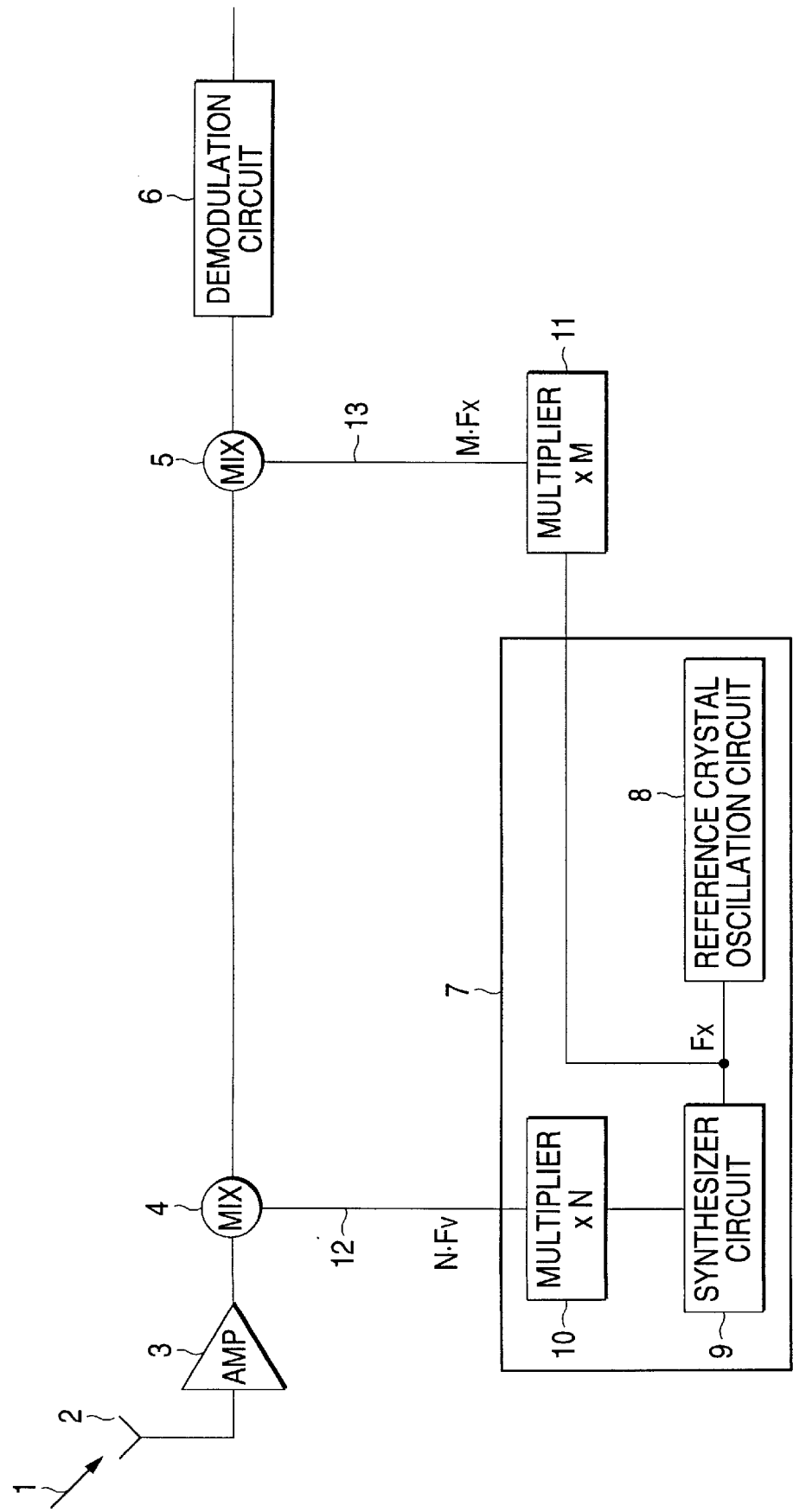
FIG. 3 is a block diagram showing a configuration of a small wireless radio according to a second embodiment of the present invention.

FIG. 3 shows the configuration of a small wireless radio according to second embodiment of the present invention, which is a direct conversion receiver in which a first local oscillation circuit is constituted by a synthesizer circuit section.

In FIG. 3, parts the same as or equivalent to those of FIG. 1 are correspondingly referenced. In this embodiment, an output $F_X$ of a reference crystal oscillation circuit portion 8 is used as a reference frequency, and a signal $N \cdot F_X$ obtained by multiplying an output $F_V$ of a synthesizer circuit 9 by N by a multiplier 10 is used as a first local oscillation signal 12 to be supplied to a first mixer 4. On the other hand, a signal $M \cdot F_X$ obtained by multiplying the output $F_X$ of the reference crystal oscillation circuit portion 8 by M by a multiplier 11 is used as a second local oscillation signal 13 to be supplied to a second mixer 5.

Figure 4:
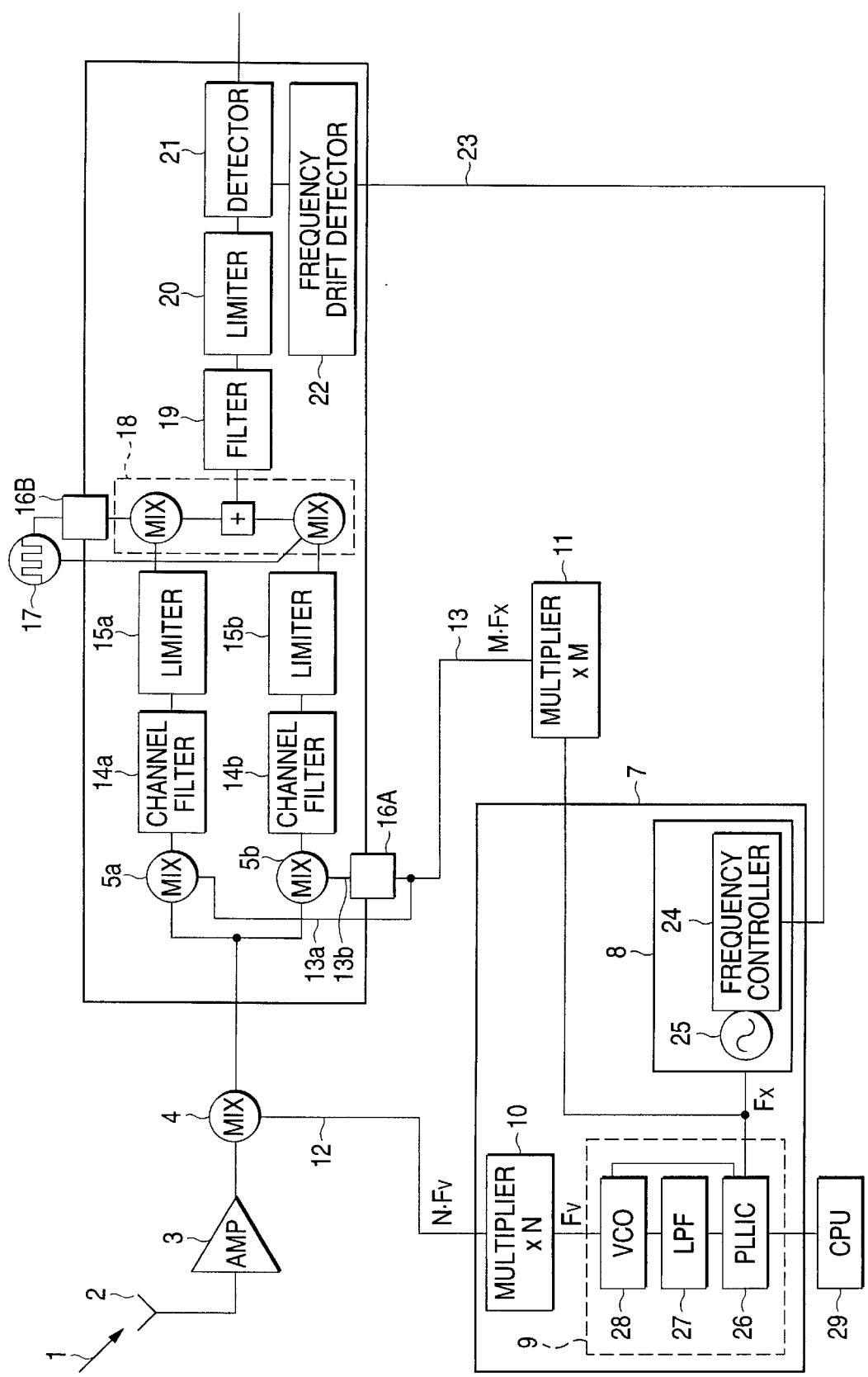
FIG. 4 is a block diagram showing a specific configuration of the small wireless radio according to the second embodiment.
Figure 5:
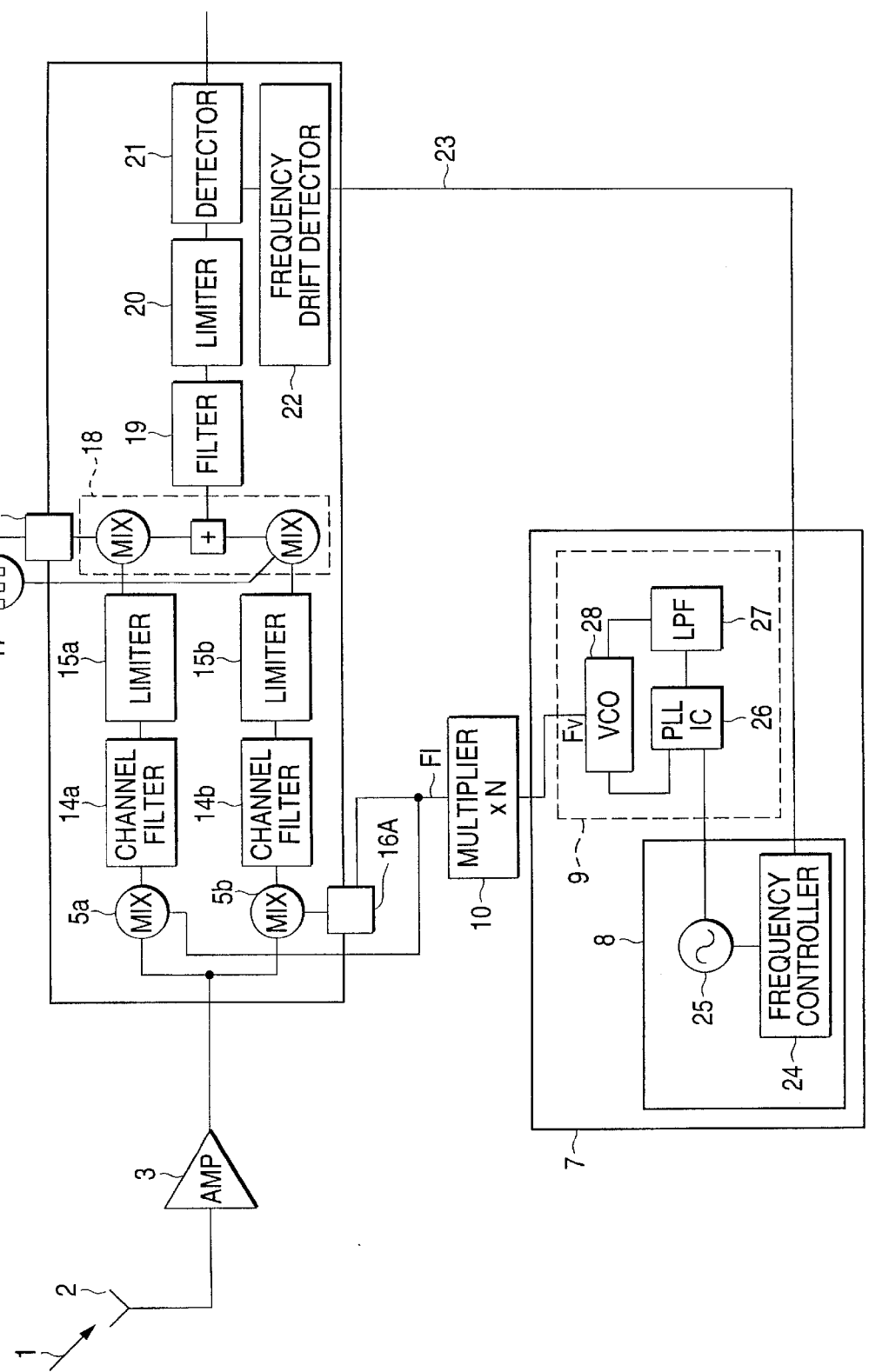
FIG. 5 is a block diagram showing a configuration of a conventional small wireless radio.

Next, the operation of the second embodiment according to the present invention will be described with reference to FIG. 4 which shows a further specific configuration. First, the frequency $F_v$ produced from the synthesizer circuit 9 for varying the channel frequency on the basis of a signal produced from a CPU 29 by using the frequency $F_x$ of the signal produced from the reference crystal oscillation circuit portion 8 as the reference signal is multiplied by N by the multiplier 10 to thereby obtain a first local oscillation signal of the frequency of $N \cdot F_v$. In the first mixer 4, the FSK modulation signal of the reception frequency $f_0$ which is received through the antenna 2 is mixed with the first local oscillation signal 12 of the frequency $N \cdot F_v$ so as to produce a mixed signal of a frequency of $f_0 - N \cdot F_v$. On the other hand, the frequency $F_x$ produced from the reference crystal oscillation circuit portion 8 is multiplied by M by the multiplier 11 to thereby obtain a second oscillation signal 13 of the frequency $M \cdot F_x$. The mixed signal having the frequency $f_0 - N \cdot F_v$, is supplied from the first mixer 4 to each of the second mixers 5a and 5b. On the other hand, the second local oscillation signal 13 having the frequency of $M \cdot F_x$ produced from the multiplier 11 is supplied to the second mixers 5a and 5b directly and through an invertor 16 as the second local oscillation signals 13a and 13b respectively, so that the frequency $f_0 - N \cdot F_v$ is orthogonally converted through the second mixers 5a and 5b.

The I and Q base band signals obtained through the orthogonal conversion are band-limited in channel filters 14a and 14b and limiter amplifiers 15a and 15b respectively and then subjected to orthogonal modulation in an orthogonal modulator 18. The thus orthogonally modulated signal is converted into an FSK wave through a filter 19 and a limiter amplifier 20, and the frequency of the FSK wave is detected by a detector 21. The average voltage of the frequency-to-voltage relational characteristic (an F/V curve) obtained through the frequency detection by the detector 21 is compared with a reference voltage in a frequency drift detector 22.

An AFC control signal 23 outputted from the frequency drift detector 22 correspondingly to the quantity of frequency deviation of the mean voltage of the F/V curve is supplied to a frequency control portion 24 of the reference crystal oscillation circuit portion 8. The frequency control portion 24 controls the frequency of a crystal oscillation circuit 25 so that the second local oscillation signal 13 corrects the frequency drift between the mean voltage of the F/V curve and the reference voltage. Similarly to the second local oscillation signal 13, the first local oscillation signal 12 acts so as to correct the frequency drift because, in the synthesizer circuit section 7, the output of the reference crystal oscillation circuit portion 8 is supplied, as a reference frequency, to a PLLIC 26 of the synthesizer circuit 9. Moreover, because the crystal oscillation circuit 25 outputs an oscillation signal which is high in C/N ratio, the multiplication number M of the multiplier 11 is preferably to set larger than the multiplication number N of the multiplier 10. Consequently, in the foregoing configuration, the following equation is established.

$f_0 = M \cdot F_X + N \cdot F_V$ $M \cdot F_X > N \cdot F_V$

In the thus configured second embodiment according to the present invention, the oscillation frequency $F_X$ outputted from the reference crystal oscillation circuit portion 8 is multiplied by M to thereby obtain the frequency $M \cdot F_X$ of the second local oscillation signal 13 so that it is possible to reduce the frequency $N \cdot F_V$ of the first local oscillation signal 12. That is, even when the frequency $F_V$ is fixed, the multiplication factor N of the first local oscillation circuit can be reduced. Further, since the local oscillation frequencies are selected so as to establish the condition $M \cdot F_X > N \cdot F_V$, the local oscillation frequency $N \cdot F_V$ outputted from the synthesizer circuit portion can be reduced, and the value of the multiplication factor N of the multiplier can be reduced without making the oscillation frequency of the VCO per se high. Since the multiplication factor N of the multiplier can be reduced, the comparison frequency of the synthesizer can be set to a value larger than that of the conventional one to make it possible to shorten the frequency convergence time.

Moreover, the C/N characteristic of the local oscillation circuit constituted by the synthesizer can be improved. Further, since the frequency selection can be performed in a lower frequency range where the multiplication factor is small, the spurious characteristic is improved. Furthermore, since the local oscillation frequency is different from the reception frequency, it is possible to omit a shielding plate of the local oscillation circuit for preventing deterioration of the reception characteristic of receiver due to radiation of the local oscillation frequency. Consequently, excellent mount efficiency can be obtained so that the material cost can be reduced.

As described above, according to the present invention, the value of the multiplication factor N of the multiplier can be reduced, and therefore, the comparison frequency of the synthesizer can be selected to be larger than the conventional one to thereby make it possible to shorten the frequency convergence time. Moreover, the C/N characteristic of the local oscillation circuit constituted by the synthesizer can be improved. Further, since the frequency selection can be performed in a lower frequency range where the multiplication factor is small, the spurious characteristic can be improved. Furthermore, there is such an effect that since the local oscillation frequency is made to be different from the reception frequency, it is possible to omit a shielding plate of the local oscillation circuit for preventing deterioration of the reception characteristic of receiver due to radiation of the local oscillation frequency, so that excellent mount efficiency can be obtained to thereby reduce the material cost.

What is claimed is:

1. A small wireless radio for receiving a frequency shift keying (FSK) modulation signal comprising:

an oscillation circuit for generating a reference oscillation signal having a predetermined frequency;

a first multiplier for multiplying by a first multiplication factor (M) the predetermined frequency of the reference oscillation signal outputted from said oscillation circuit;

a first mixer for mixing said FSK modulation signal received through an antenna with a first local oscillation signal which is an output of said first multiplier;

a synthesizer circuit for varying a channel frequency on the basis of a signal supplied from a CPU by using, as a reference frequency, the predetermined frequency of the reference oscillation signal outputted from said oscillation circuit;

a second multiplier for multiplying by a second multiplication factor (N) a frequency of a signal outputted from said synthesizer circuit;

a second mixer for mixing a first mixed signal outputted from said first mixer with a second local oscillation signal which is an output of said second multiplier;

a demodulation circuit for demodulating a second mixed signal outputted from said second mixer; and a frequency drift detector for detecting a frequency drift of the demodulated signal and for outputting an auto frequency control (AFC) signal corresponding to a quantity of the detected frequency drift, wherein the predetermined frequency of said oscillation circuit is controlled on the basis of said AFC signal.

2. A small wireless radio according to claim 1, wherein said oscillation circuit includes a crystal oscillation circuit and a frequency controller for controlling a frequency of said oscillation circuit on the basis of said AFC signal.

3. A small wireless radio according to claim 1, wherein the frequency of the signal which is output from said first multiplier is larger than the frequency of the signal which is outputted from said second multiplier.

4. A small wireless radio for receiving a frequency shift keying (FSK) modulation signal comprising:

an oscillation circuit for generating a reference oscillation signal having a predetermined frequency;

a synthesizer circuit for varying a channel frequency on the basis of a signal supplied from a CPU by using, as a reference frequency, the predetermined frequency of the reference oscillation signal outputted from said oscillation circuit;

a first multiplier for multiplying by a first multiplication factor (N) the frequency of the signal outputted from said synthesizer circuit;

a first mixer for mixing said FSK modulation signal received through an antenna with a first local oscillation signal which is an output of said first multiplier;

a second multiplier for multiplying by a second multiplication factor (M) the frequency of the signal outputted from said oscillation circuit;

a second mixer for mixing a first mixed signal outputted from said first mixer with a second local oscillation signal which is an output of said second multiplier;

a demodulation circuit for demodulating a second mixed signal outputted from said second mixer; and a frequency drift detector for detecting frequency drift of the demodulated signal and for outputting an auto frequency control (AFC) signal corresponding to a quantity of the detected frequency drift, wherein the predetermined frequency of said oscillation circuit is controlled on the basis of said AFC control signal.

5. A small wireless radio according to claim 4, wherein said oscillation circuit includes a crystal oscillation circuit and a frequency controller for controlling a frequency of said oscillation circuit on the basis of said AFC signal.

6. A small wireless radio according to claim 4, wherein the frequency of the signal which is output from said second multiplier is larger than the frequency of the signal which is outputted from said first multiplier.

* * * * *